(12) United States Patent
Afghahi

(10) Patent No.: US 6,967,857 B2
(45) Date of Patent: *Nov. 22, 2005

(54) DENSE CONTENT ADDRESSABLE MEMORY CELL

(75) Inventor: Morteza Cyrus Afghahi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/030,810

(22) Filed: Jan. 7, 2005

(65) Prior Publication Data

US 2005/0117427 A1 Jun. 2, 2005

Related U.S. Application Data

(63) Continuation of application No. 10/736,350, filed on Dec. 15, 2003, and a continuation-in-part of application No. 10/375,880, filed on Feb. 26, 2003, now Pat. No. 6,751,112, which is a continuation-in-part of application No. 10/127,175, filed on Apr. 22, 2002, now abandoned, said application No. 10/736,350.

(60) Provisional application No. 60/448,551, filed on Feb. 19, 2003.

(51) Int. Cl.[7] ............................ G11C 15/00; G11C 11/00
(52) U.S. Cl. ............................. 365/49; 365/154; 365/156
(58) Field of Search ................................. 365/49, 154, 156

(56) References Cited

U.S. PATENT DOCUMENTS 3,609,710 A    9/1971    Browne (Continued)

OTHER PUBLICATIONS

Miyatake, H. et al., "A Design For High-Speed Low-Power CMOS Fully Parallel Content-Addressable Memory Macros", IEEE Journal of Solid-State Circuits, IEEE Inc., vol. 36, No. 6, Jun. 2001, pp. 956-968.

(Continued)

*Primary Examiner*—Trong Phan

(74) *Attorney, Agent, or Firm*—McAndrews, Held & Malloy Ltd.

(57) ABSTRACT

A content addressable memory cell (10) comprises a word line 12, a first bit line (14), and a second bit line (16). A pair of transistors (30–31) is arranged to store bits of data at first and second points (35 and 36). A first transistor (26) is coupled to the word line, the first bit line and the first point. A second transistor (27) is coupled to the word line, the second bit line and the second point. The word line voltage is changed in accordance with process parameters to allow conduction by the first and second transistors to compensate for leakage by the pair of transistors. For example, the first and second transistors may be operated in a triode mode.

20 Claims, 1 Drawing Sheet

U.S. PATENT DOCUMENTS

| | | | |
|---|---|---|---|
| 5,475,633 A | | 12/1995 | Mehalel |
| 5,881,010 A | * | 3/1999 | Artieri .......................... 365/156 |
| 6,125,049 A | * | 9/2000 | Nataraj .......................... 365/49 |
| 6,157,557 A | * | 12/2000 | Lee et al. ...................... 365/49 |
| 6,181,591 B1 | * | 1/2001 | Miyatake et al. ........... 365/156 |
| 6,195,278 B1 | * | 2/2001 | Calin et al. ................... 365/49 |
| 6,222,780 B1 | * | 4/2001 | Takahashi .................... 365/154 |
| 6,266,263 B1 | * | 7/2001 | Lien et al. ..................... 365/49 |
| 6,421,265 B1 | | 7/2002 | Lien et al. |

OTHER PUBLICATIONS

Noda, K. et al., "A 1.9-$\mu$m2 Loadless CMOS Four-Transistor SRAM Cell in a 0.18-$\mu$m Logic Technology", Electron Devices Meeting, 1998. IEDM '98 Technical Digest, International San Francisco, CA, 1998, pp. 643-646.

Grosspietsch, K.E., "Associative Processors and Memories: A Survey", IEEE Micro, vol. 12, No. 3, Jun. 1, 1992, pp. 12-19.

"High Performance Static Content Addressable Memory Cell", IBM Technical Disclosure Bulletin, IBM Corp., vol. 32, No. 3A, Aug. 1, 1989, p. 478.

Fitchen, Franklin C., "Transistor Circuit Analysis And Design", D. Van Nostrand Co. (1960), pp. 304-314.

* cited by examiner

DENSE CONTENT ADDRESSABLE MEMORY CELL

CROSS-REFERENCE TO RELATED APPLICATIONS

This application is a continuation of U.S. application Ser. No. 10/736,350 filed Dec. 15, 2003, which is a continuation-in-part of U.S. application Ser. No. 10/127,175 filed Apr. 22, 2002 now abandoned. Said U.S. application Ser. No. 10/736,350 is also a continuation-in-part of U.S. application Ser. No. 10/375,880 filed Feb. 26, 2003 now U.S. Pat. No. 6,751,112, which is a continuation-in-part of U.S. application Ser. No. 10/127,175 filed Apr. 22, 2002 now abandoned. Said U.S. application Ser. No. 10/736,350 claims priority to and benefit from U.S. application Ser. No. 60/448,551 filed Feb. 19, 2003. The above-identified applications are hereby incorporated herein by reference in their entirety.

BACKGROUND OF THE INVENTION

This invention relates to memory cells and more particularly relates to content addressable memory cells.

Many memory devices store and retrieve data by addressing specific memory locations. As a result, this path often becomes the limiting factor for systems that rely on fast memory access. The time required to find an item stored in memory can be reduced considerably if the stored data item can be identified for access by the content of the data itself rather than by its address. Memory that is accessed in this way is called content-addressable memory (CAM). CAM provides a performance advantage over other memory search algorithms (such as binary and tree-based searches or look-aside tag buffers) by comparing the desired information against the stored data simultaneously, often resulting in an order-of-magnitude reduction of search time.

A CAM cell is the basic circuit determining the speed, size and power consumption of a CAM system. Known CAM cells require a substantial number of transistors that consume power and require a substantial amount of area on a chip. In addition, match circuitry employed in known CAM cells requires a substantial amount of time for proper operation. This invention addresses these problems and provides a solution.

U.S. Pat. No. 6,222,780 (Takahashi, filed Mar. 9, 2000), describes an SRAM memory cell in which transistors 11 and 12 are turned off, and are said to allow an off-leak current to flow therethrough to maintain the on- or off-state of driver nMOS transistors 13 and 14. However, the off-state of the transistors 11 or 12 gives only a single compensation point. In real silicon, the leakage of the transistor 13 or 14 can vary over a very wide range due to changes in process corners, temperatures and power supply variation. In many applications, for example mobile devices, the voltage supply is intentionally kept low to save power in the sleep mode or normal operation.

In the 0.13 micrometer (um) and future process technologies, $I_{off}$ and gate leakage are becoming significant factors. Referring to FIG. 3, of U.S. Pat. No. 6,181,591 (Miyatake et al., issued Jan. 30, 2001, the "'591 patent"), node 18 will never be set to a full VDD supply voltage because NMOS transistors 16 and 17 can not pass a full VDD voltage. As a result, match transistor 25 always is partially on. Since many match transistors (e.g., 256) may be connected to the match line, arrangement shown in the '259 patent will not work for current and future process technologies. This is particularly true at higher temperatures where the leakage current is very significant.

Another problem with current and future process technologies is gate leakage. NMOS transistor leakage is 5–10 time greater than PMOS gate leakage. If match transistor 25 shown in FIG. 3 of the '591 patent is used in connection with a four transistor SRAM cell, such as cell 11, the gate leakage of transistors 16 and 17 will make the design more difficult.

Further limitations and disadvantages of conventional and traditional approaches will become apparent to one of skill in the art, through comparison of such systems with the present invention as set forth in the remainder of the present application with reference to the drawings.

BRIEF SUMMARY OF THE PREFERRED EMBODIMENTS

One apparatus embodiment of the invention provides a memory cell comprising a first bit line, a second bit line and a pair of transistors arranged to store a first bit of data at a first point and a second bit of data that is the complement of the first bit of data at a second point. A first transistor is coupled to the first bit line and the first point, and a second transistor is coupled to the second bit line and the second point. A word line is coupled to the first transistor and second transistor. The word line carries a voltage changed in accordance with process parameters to allow current conduction of the first and second transistors that compensates for leakage by the pair of transistors.

One method embodiment of the invention is useful in connection with a memory cell comprising a first bit line, a second bit line, a pair of transistors arranged to store a first bit of data at a first point and a second bit of data that is the complement of the first bit of data at a second point, a first transistor coupled to the first bit line and the first point, a second transistor coupled to the second bit line and the second point and a word line coupled to the first transistor and second transistor. In such an environment, current conduction is allowed that compensates for leakage by the pair of transistors by changing the word line voltage in accordance with process parameters to make the first and second transistors partially conductive.

By using the foregoing type of cell, the number of components in the CAM can be reduced and the speed of operation can be increased. In addition, the power consumption of the cell can be reduced.

These and other advantages and novel features of the present invention, as well as details of an illustrated embodiment thereof, will be more fully understood from the following description and drawings.

DETAILED DESCRIPTION OF THE INVENTION

Figure 1:
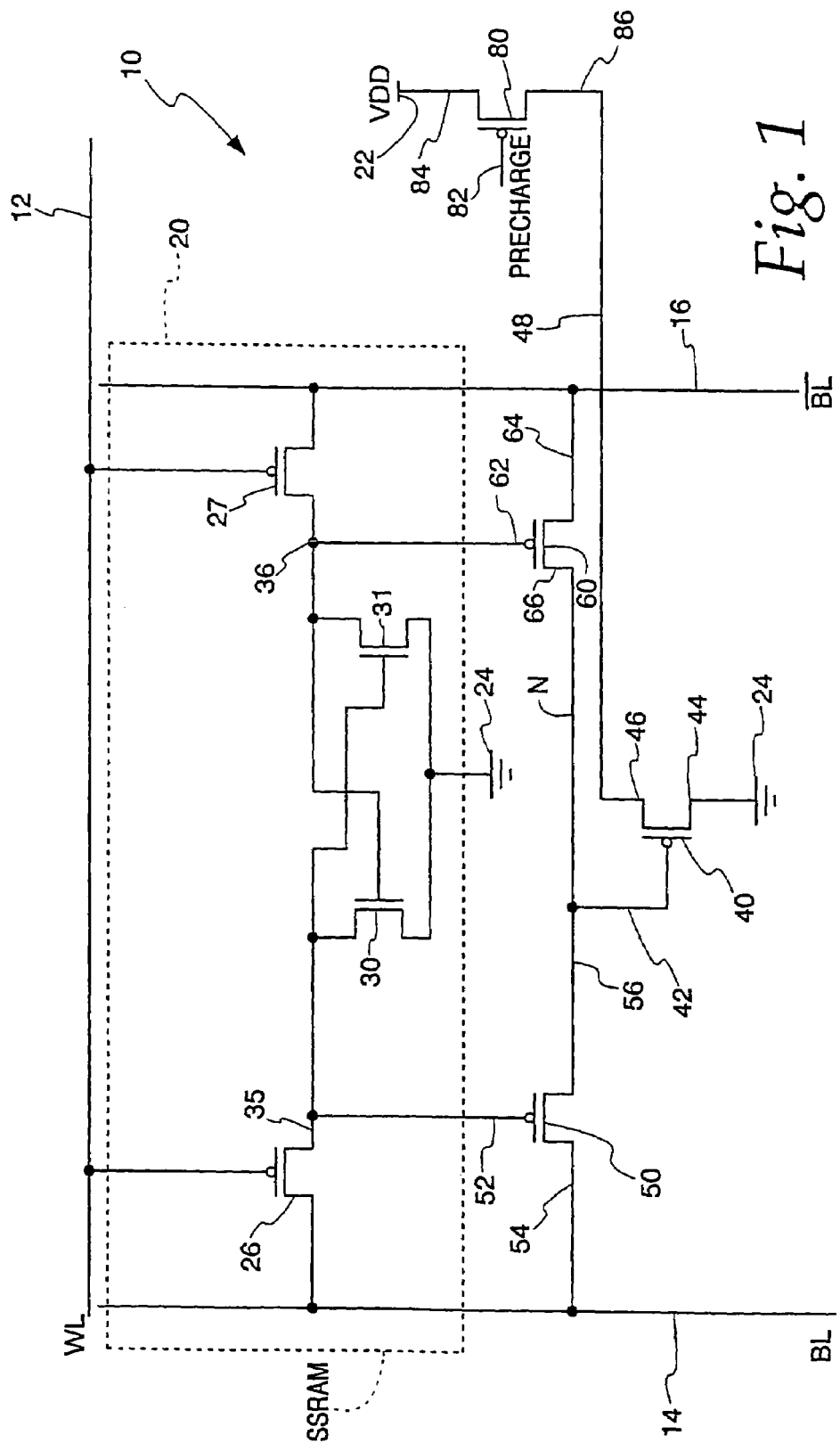
FIG. 1 is a schematic diagram of one embodiment of the invention.

Referring to FIG. 1, one embodiment of a CAM cell 10 embodying the invention includes a word line 12 and bit lines 14 and 16. Cell 10 includes a semi-static (SSRAM) or dynamic random access memory type circuit 20 including a source 24 of a reference voltage, such as ground potential. Circuit 20 also includes p-channel MOSFET transistors 26–27 and n-channel MOSFET transistors 30–31 cross-coupled as shown. Transistors 26–27 serve as both reading and writing transistors also called access and loading transistors. Transistors 26–27 may comprise low voltage threshold transistors in order to compensate for the leakage in circuit 20. A low voltage threshold transistor is a transistor, for example, that is switched to its saturation mode with a gate voltage in the range of 200 millivolts to 300 millivolts.

To make sure that the leakage through the p-channel transistors compensates for the leakage through the n-channel transistors, the voltage on word line 12 can be adaptively changed for proper operation at various process parameters, such as process corners and temperatures. If necessary, line 12 is reduced in voltage below VDD (the supply voltage) so that transistors 26 and 27 are partially conductive, thus allowing current conduction that compensates for leakage by transistors 30 and 31. In addition, p-channel transistors 26–27 are better than n-channel transistors to supply charges at circuit points 35 and 36 to maintain the stored data. Bit lines are kept at VDD (precharged) in a default or a no activity state to provide the charges.

Transistors 26 and 27 can be operated in three different modes of operation:

a cutoff mode in which no current flows from source to drain (with the possible exception of a very small reverse current) and in which changes in the gate to drain voltage do not further reduce current flow;

a saturation mode in which the current flowing from source to drain is at a maximum value limited by the external resistance in the circuit and in which changes in the gate to drain voltage do not further increase current flow; and a triode mode in which the drain current is at values between the current flow during cutoff and saturation and in which the amount of drain current flow is regulated by changes in the gate to drain voltage.

Examples of the process corners used during manufacture of the memory cell are as follows: The NMOS is slow and PMOS is fast (SF corner). In this SF corner, the sub-threshold leakage current of the NMOS is an order of magnitude more than typical NMOS sub-threshold leakage current, and the sub-threshold leakage current of the PMOS is an order of magnitude less than typical PMOS sub-threshold leakage current. The range of difference is magnified by environmental temperatures typically encountered in commercial applications of memory cells. Higher temperature results in higher leakage. For example, for every 10 degrees C. increase in environmental temperature, the leakage current may double. For an FS corner, where NMOS is fast and PMOS is slow, the situation is reversed; that is, the sub-threshold leakage current of NMOS is lower than typical and the sub-threshold leakage current of PMOS is higher than typical.

Examples of environmental temperatures for which memory cells are designed for commercial applications typically vary in a range of −10 degrees C. to 125 degrees C. Considering this temperature range and going from SF to FS, the ratio of NMOS leakage current to PMOS leakage current can vary, for example, from 1/1 to 1/1000 and vice versa.

An example of the range of voltages applied to the word line to make transistors 26–27 partially conductive can be, for example, between 0–0.5v in a 0.13 um technology where the supply voltage is 1.2V.

An example of the range of current flow through transistors 26 and 27 when they are partially conductive and operated in the triode mode can go, for example, from 10 nA to 10 uA.

Each of the foregoing examples applies to 0.13 um memory cell technology. Other process parameters, voltage ranges and current ranges are applicable to other memory cell fabrication technologies.

Thus, the embodiment shown in FIG. 1 is able to store complementary bits of data with only four transistors, while conventional SRAM cells require six transistors. By using the embodiment shown in FIG. 1, substantial area is saved on a chip incorporating the cell shown in FIG. 1.

Voltage levels corresponding to stored data bits are stored at points 35–36 of circuit 20. The data bits stored at points 35–36 are complements of each other.

Test bits of data are transmitted on bit lines 14 and 16. The test bits of data also are complements of each other.

A switching p-channel match transistor 40 comprises a gate 42 connected to a node N, a source 44 and a drain 46 that is connected to a word match line 48. A p-channel MOSFET transistor 50 comprises a gate 52 connected to point 35, a source 54 connected to line 14 and a drain 56 connected to node N as shown. A p-channel MOSFET transistor 60 comprises a gate 62 connected to point 36, a source 64 connected to line 16 and a drain 66 connected to a node N as shown. Alternatively, transistors 50 and 60 may be n-channel transistors.

A precharge p-channel transistor 80 comprises a gate 82 connected to a precharge circuit (not shown), a source 84 connected to source 22 of voltage and a drain 86 connected to line 48 as shown.

In each of the foregoing transistors, the source-drain path forms a circuit path.

In the precharge state, both lines 14 and 16 are precharged to a logical one state (e.g., to a voltage near VDD) and node N also is precharged to a logical one state (e.g., to a voltage near VDD) through transistors 50 or 60, causing match transistor 40 to be completely cut off. The match line 48 also is precharged to VDD.

In the compare state, one of lines 14 and 16 is driven to a logical zero state (e.g., to a voltage near ground potential). If there is a mismatch between the data stored at points 35–36 and the test data represented by the logical states of lines 14 and 16, node N is switched to a logical zero state, causing transistor 40 to discharge the voltage of match line 48 to a level below a logical one (VDD) state. Transistor 40 does not discharge match line 48 down to zero volts. As a result, power is saved. A sense amplifier (not shown) detects whether the match line 48 has gone below VDD.

For example, a mismatch occurs if a logical one is stored at point 35, a logical zero is stored at point 36, a logical zero is transmitted on line 14 and a logical one is transmitted on line 16. Conversely, a match occurs if a logical one is stored at point 35, a logical zero is stored at point 36, a logical one is transmitted on line 14 and a logical zero is transmitted on line 16.

In case of a match, the gate of transistor 40 stays at VDD, keeping transistor 40 in an off state. The match line then does not discharge through transistor 40; the match line 48 stays at VDD.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. A memory cell, comprising:
   a first bit line;
   a second bit line;
   a plurality of transistors configured to store a first bit of data at a first point and a second bit of data at a second point, the plurality of transistors being operatively coupled to the first bit line and the second bit line;
   a match transistor that is switchable to a first state and to a second state, the first state being in response to a first predetermined relationship between first and second bits and third and fourth bits transmitted on the first bit line and the second bit line, the second state being in response to a second predetermined relationship between the first and second bits and the third and fourth bits;
   a first p-channel transistor operatively coupled to the first bit line, the first point and the match transistor; and
   a second p-channel transistor operatively coupled to the second bit line, the second point and the match transistor.

2. The memory cell according to claim 1, wherein the match transistor comprises a p-channel transistor.

3. The memory cell according to claim 1,
   wherein the match transistor comprises a gate and an output circuit path that is operatively coupled tcra match line, and
   wherein the memory cell comprises a node operatively coupled to the gate, the first p-channel transistor and the second p-channel transistor.

4. The memory cell according to claim 3, comprising:
   a third transistor configured to charge the node.

5. The memory cell according to claim 4, wherein the third transistor comprises a p-channel transistor.

6. The memory cell according to claim 4, comprising:
   a fourth transistor configured to charge the match line.

7. The memory cell according to claim 4, wherein the third transistor charges the node so that the match transistor is cut off.

8. The memory cell according to claim 1, wherein the first p-channel transistor and the second p-channel transistor comprises p-channel field-effect transistors (FETs).

9. The memory cell according to claim 1, wherein the plurality of transistors are part of a dynamic memory circuit.

10. The memory cell according to claim 1, wherein the plurality of transistors are part of a semi-static memory circuit.

11. The memory cell according to claim 10, wherein the semi-static memory circuit comprise low-voltage threshold transistors.

12. The memory cell according to claim 11, wherein the low-voltage threshold transistors compensate for leakage in the semi-static memory circuit.

13. The memory cell according to claim 1, wherein the first p-channel transistor and the second p-channel transistor pass a full power supply voltage.

14. The memory cell according to claim 1, comprising:
    a word line carrying a voltage that is adapted to compensate for leakage current.

15. The memory cell according to claim 1, wherein the first bit is the complement of the second bit.

16. The memory cell according to claim 1, wherein the memory cell comprises a content addressable memory cell.

17. The memory cell according to claim 1, wherein the plurality of transistors comprises a pair of transistors.

18. The memory cell according to claim 1, wherein the plurality of transistors is a pair of transistors.

19. The memory cell according to claim 1, wherein the plurality of transistors comprises a pair of cross-coupled transistors.

20. A content addressable memory cell, comprising:
    a first bit line;
    a second bit line;
    a plurality of transistors configured to store a first bit of data at a first point and a second bit of data at a second point, the plurality of transistors being operatively coupled to the first bit line and the second bit line;
    a match transistor that is switchable to a first state and to a second state, the first state being in response to a first predetermined relationship between first and second bits and third and fourth bits transmitted on the first bit line and the second bit line, the second state being in response to a second predetermined relationship between the first and second bits and the third and fourth bits;
    a first p-channel transistor operatively coupled to the first bit line, the first point and the match transistor; and
    a second p-channel transistor operatively coupled to the second bit line, the second point and the match transistor.

* * * * *